(12) United States Patent
Cai et al.

(10) Patent No.: US 6,531,376 B1
(45) Date of Patent: Mar. 11, 2003

(54) METHOD OF MAKING A SEMICONDUCTOR DEVICE WITH A LOW PERMITTIVITY REGION

(75) Inventors: Weizhong Cai, Scottsdale, AZ (US); Chandrasekhara Sudhama, Phoenix, AZ (US); Yujing Wu, Chandler, AZ (US); Keith Kamekona, Scottsdale, AZ (US)

(73) Assignee: Semiconductor Components Industries LLC, Phoenix, AZ (US)

( * ) Notice: Subject to any disclaimer, the term of this patent is extended or adjusted under 35 U.S.C. 154(b) by 0 days.

(21) Appl. No.: 10/123,657

(22) Filed: Apr. 17, 2002

(51) Int. Cl.[7] .............................................. H01L 21/76
(52) U.S. Cl. .................. 438/422; 438/411; 438/456; 438/619; 438/238; 438/381; 438/329; 438/412
(58) Field of Search .................. 438/619, 618, 438/622, 626, 624, 637, 701, 713, 238, 411, 412, 421, 381, 422, 456, 329

(56) References Cited

U.S. PATENT DOCUMENTS

| | | | | |
|---|---|---|---|---|
| 4,169,000 A | * | 9/1979 | Riseman | 257/510 |
| 5,759,913 A | * | 6/1998 | Fulford et al. | 438/422 |
| 5,792,706 A | * | 8/1998 | Michael et al. | 438/626 |
| 5,814,555 A | * | 9/1998 | Bandyopadhyay et al. | 438/619 |
| 6,087,701 A | * | 7/2000 | Bergstrom et al. | 257/414 |
| 6,211,561 B1 | * | 4/2001 | Zhao | 257/522 |
| 6,214,719 B1 | * | 4/2001 | Nag | 438/421 |
| 6,313,008 B1 | * | 11/2001 | Leung et al. | 257/510 |
| 6,368,939 B1 | * | 4/2002 | Sasaki | 438/411 |
| 6,395,618 B2 | * | 5/2002 | Vergani et al. | 438/411 |
| 6,399,476 B2 | * | 6/2002 | Kim et al. | 438/619 |
| 6,413,852 B1 | * | 7/2002 | Grill et al. | 438/618 |

* cited by examiner

*Primary Examiner*—Stephen D. Meier
*Assistant Examiner*—Khanh B. Duong
(74) *Attorney, Agent, or Firm*—James J. Stipanuk

(57) ABSTRACT

A method of making a semiconductor device (10) having a low permittivity region (24) includes forming a first layer (30/42) over a surface of a trench (20), and etching through an opening (70) in the first layer that is smaller than a width (W2) of the trench to remove a first material (38) from the trench. A second material (44) is deposited to plug the opening to seal an air pocket (40) in the trench. The low permittivity region features air pockets with a high volume because the small size of the opening allows the second material to plug the trench without accumulating significantly in the trench.

20 Claims, 5 Drawing Sheets

METHOD OF MAKING A SEMICONDUCTOR DEVICE WITH A LOW PERMITTIVITY REGION

BACKGROUND OF THE INVENTION

The present invention relates in general to semiconductor devices and, more particularly, to integrated circuits having a low permittivity dielectric region for forming high frequency passive components.

The market for electronic systems continues to demand integrated circuits with increased functionality and a higher frequency capability. In response, semiconductor manufacturers are integrating increasing numbers of passive components on a semiconductor die along with active radio frequency (RF) circuitry. The increased integration levels are needed to reduce the cost and improve the performance of electronic systems operated at frequencies reaching five gigahertz and higher. So far, the integration of RF passive components and active circuits has been limited by the high fabrication cost of providing integrated passive components with the necessary frequency capability.

Some semiconductor manufacturers have addressed this problem by fabricating passive components on a low permittivity region of a semiconductor die in order to improve their frequency response by reducing their parasitic substrate capacitances. Low permittivity materials have been used to form these regions, but presently used materials either have a high cost or provide film thicknesses that are too thin to produce a sufficient reduction in parasitic capacitance. Other low permittivity regions are made with a thick dielectric film containing air pockets or voids that reduce the overall permittivity of the dielectric film. However, the air pockets have too small a volume because large amounts of dielectric material are redeposited in the air pockets while they are being sealed off. Moreover, the film thicknesses needed to seal off the air pockets add substantially to the difficulty and cost of the subsequent formation of transistors and other active devices.

Hence, there is a need for an integrated circuit with a lower permittivity region that improves the frequency capability of the integrated circuit while maintaining a low manufacturing cost.

DETAILED DESCRIPTION OF THE DRAWINGS

In the figures, elements having the same reference number have similar functionality.

Figure 1:
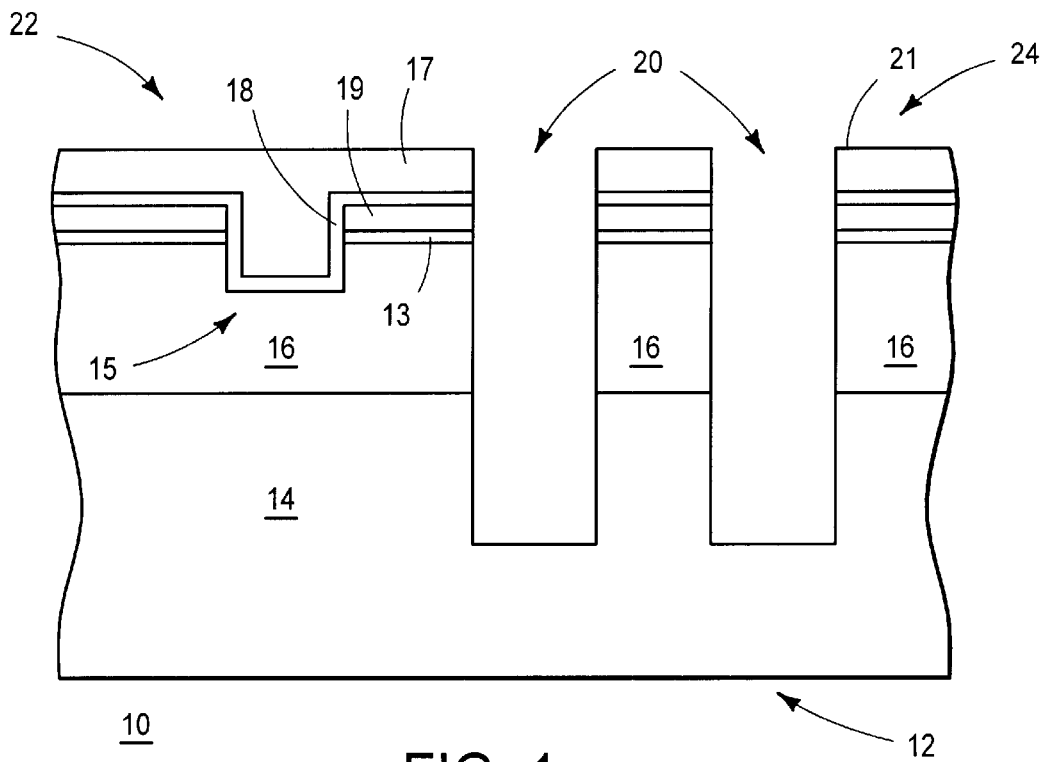
FIG. 1 is a cross-sectional view of an integrated circuit after a first fabrication stage.

FIG. 1 is a cross-sectional view of a semiconductor device or integrated circuit 10 formed on a semiconductor substrate 12 after a first stage of fabrication, including an active region 22 and a low permittivity region 24.

A base layer 14 is formed to a thickness of about two hundred fifty micrometers. In one embodiment, base layer 14 comprises monocrystalline silicon which is heavily doped to have a p-type conductivity and a resistivity of about 0.01 ohm-centimeters in order to function as a ground plane for integrated circuit 10.

An epitaxial layer 16 typically is grown to a thickness of about 1.5 micrometers over base layer 14. In one embodiment, epitaxial layer 13 comprises monocrystalline silicon doped to have an n-type conductivity and a resistivity of about twenty ohm-centimeters.

A dielectric layer 13 is formed over epitaxial layer 16 to a thickness of about three hundred angstroms. In one embodiment, dielectric layer 13 is formed with a thermally grown silicon dioxide.

A dielectric layer 19 is formed over dielectric layer 13 to a thickness of about one thousand angstroms. In one embodiment, dielectric layer 19 comprises deposited silicon nitride.

Substrate 12 is patterned and subjected to a series of etch steps to produce a recessed isolation region 15 that extends to a depth of about 0.5 micrometers into epitaxial layer 16. Isolation region 15 is used to electrically isolate transistors and other active devices (not shown) within active region 22 from each other.

A semiconductor layer 18 is formed over epitaxial layer 16 and dielectric layer 19 as shown. In one embodiment, semiconductor layer 18 comprises doped polysilicon formed to a thickness of about five hundred angstroms.

A dielectric layer 17 is formed over semiconductor layer 18 and then planarized using a chemical-mechanical polish (CMP) or spin-on photoresist and etchback process. In one embodiment, dielectric layer 17 comprises silicon dioxide deposited with a thickness of about one thousand angstroms in its regions of minimum thickness.

A surface 21 of substrate 12 is patterned with photoresist and subjected to another series of etch steps to form a matrix of recessed regions or trenches 20 that extend into base layer 14 to a depth ranging between about six and about ten micrometers. In one embodiment, trenches 20 are formed to a depth of about ten micrometers and a width of about one micrometer, with about one micrometer of separation between adjacent trenches 20.

Figure 2:
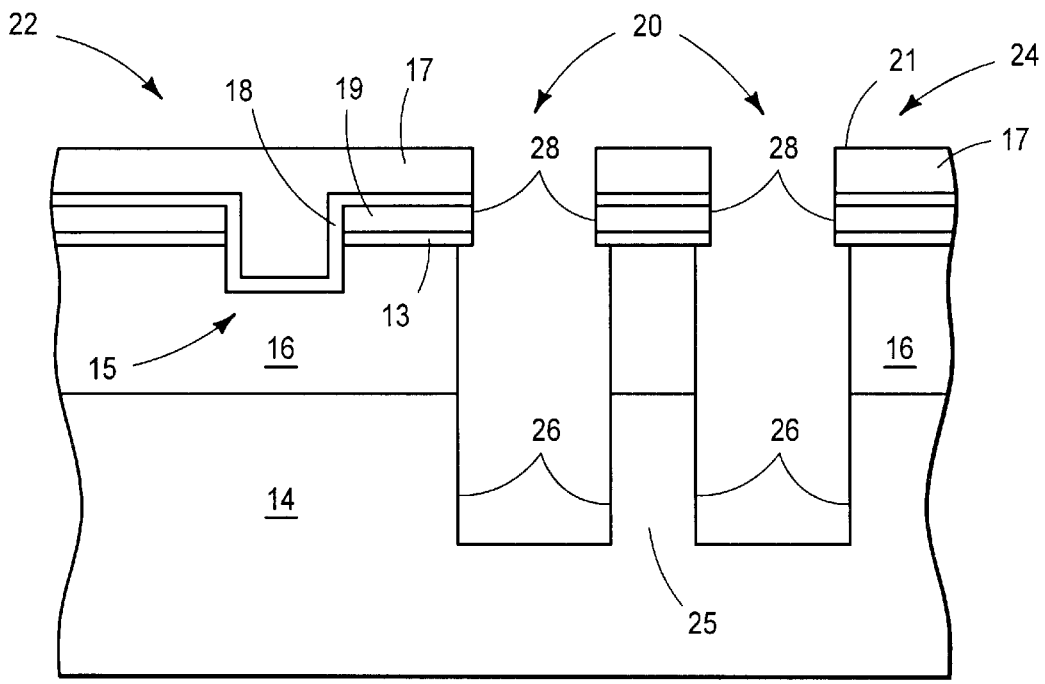
FIG. 2 is a cross-sectional view of the integrated circuit after a second fabrication stage.

FIG. 2 shows a cross-sectional view of integrated circuit 10 after a second fabrication stage. An isotropic etch step is applied to remove material from exposed semiconductor surfaces of integrated circuit 10, with the effect of removing semiconductor material to undercut sidewalls 26 relative to dielectric surfaces 28, thereby expanding the volume of trenches 20. Note that this semiconductor etch step reduces the width of a region 25 between adjacent trenches 20 to about 0.6 micrometers.

Figure 3:
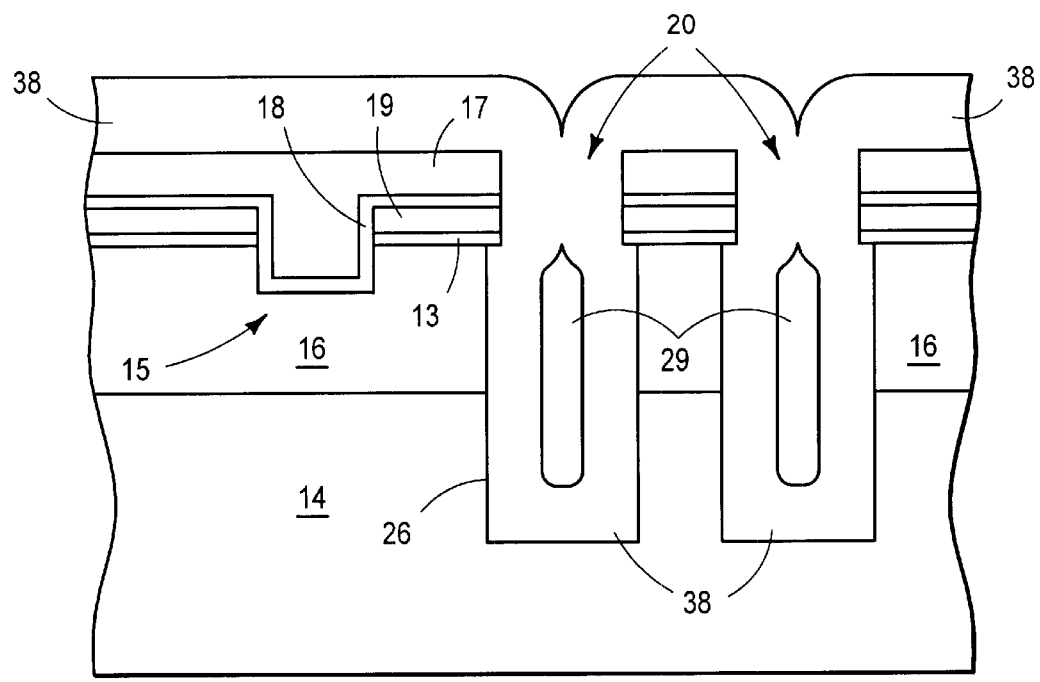
FIG. 3 is a cross-sectional view of the integrated circuit after a third fabrication stage.

FIG. 3 is a cross-sectional view of integrated circuit 10 after a third fabrication stage. A dielectric layer 38 is formed over dielectric layer 17 and deposited within trenches 20. In one embodiment, dielectric layer 38 comprises silicon dioxide deposited to a thickness of about five thousand angstroms. Typically, when dielectric layer 38 is formed, material is deposited such that voids 29 naturally occur within trenches 20. These voids 29 have the advantage of facilitating the later removal of material from trenches 20 as described below.

Figure 4:
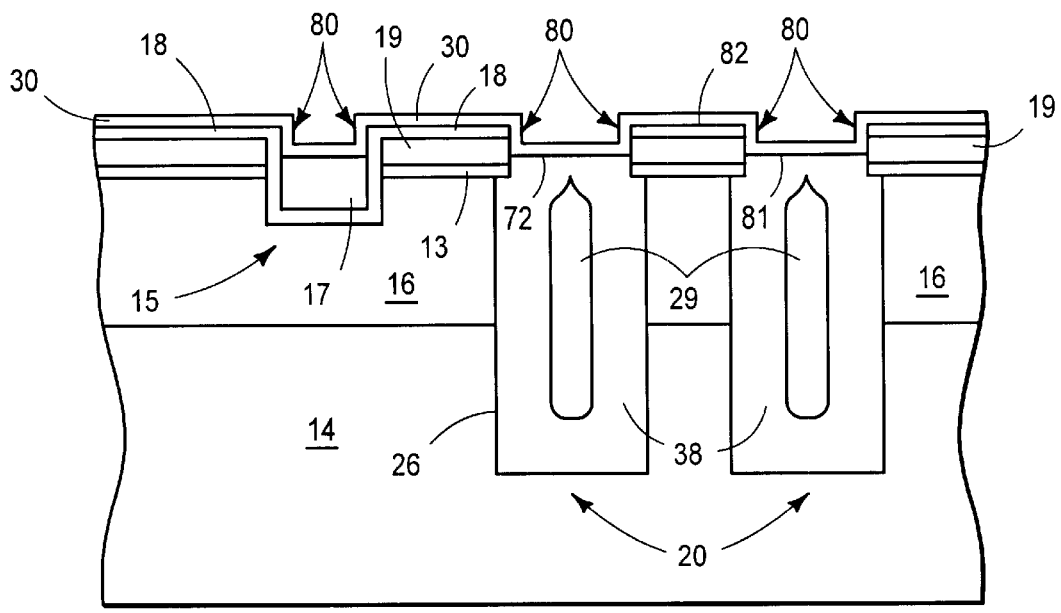
FIG. 4 is a cross-sectional view of the integrated circuit after a fourth fabrication stage.

FIG. 4 shows a cross-sectional view of integrated circuit 10 after a fourth fabrication stage. A CMP or spin-on photoresist process is used to planarize dielectric layer 38, and an etchback process removes silicon dioxide material from dielectric layers 38 and/or 17. The result of the etchback step is to expose portions of semiconductor layer 18 and to recess dielectric layers 17 and/or 38 to a level below the openings of trenches 20 and isolation region 15, in effect reducing the depth of trenches 20. In one embodiment, the etchback process recesses dielectric layer 38 within trenches 20 to form a plurality of vertical steps 80 whose respective heights are about one thousand angstroms as measured from a surface 81 of dielectric layer 38 or trenches 20 to a surface 82 of semiconductor layer 18.

A semiconductor layer 30 is formed over semiconductor layer 18 and dielectric layers 17 and 38 as shown. In one embodiment, semiconductor layer 30 comprises polysilicon deposited to a thickness of about two hundred angstroms. Note that in regions where semiconductor layer 30 overlies semiconductor layer 18, the overall thickness of semiconductor material is about seven hundred angstroms, whereas in other areas the overall thickness of semiconductor material is about two hundred angstroms. To ensure that semiconductor layer 30 adheres securely, semiconductor layer 18 is appropriately cleaned using a standard cleaning process.

Figure 5:
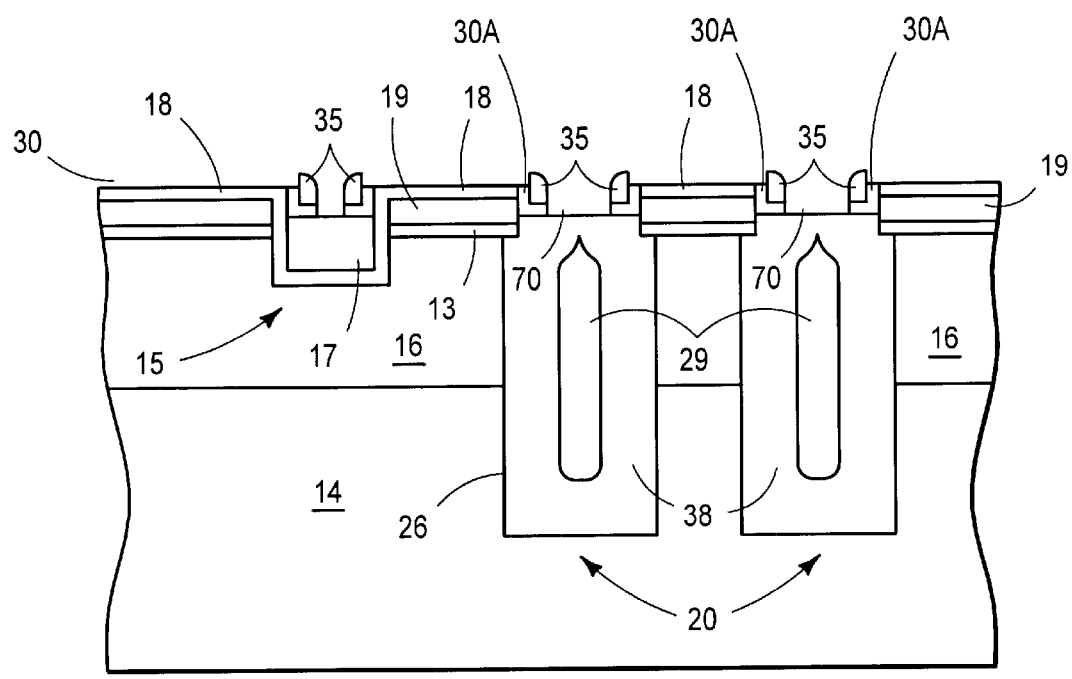
FIG. 5 is a cross-sectional view of the integrated circuit after a fifth fabrication stage.

FIG. 5 shows a cross-sectional view of integrated circuit 10 after a fifth fabrication stage. A layer of dielectric material is deposited on semiconductor layer 30 to a thickness of about two thousand five hundred angstroms and then subjected to an anisotropic reactive ion etch to form a plurality of spacers 35 adjacent to each step 80. In one embodiment, spacers 35 are formed with silicon nitride.

A timed reactive ion etch is applied to remove about two hundred angstroms of exposed semiconductor material, effectively removing semiconductor layer 30 where it overlies semiconductor layer 18. Where semiconductor layer 30 is masked by spacers 35, little or no semiconductor material is removed, resulting in a plurality of boots or ledges 30A being formed adjacent to spacers 35 as shown to define openings 70 that are smaller than the width of trenches 20.

Figure 6:
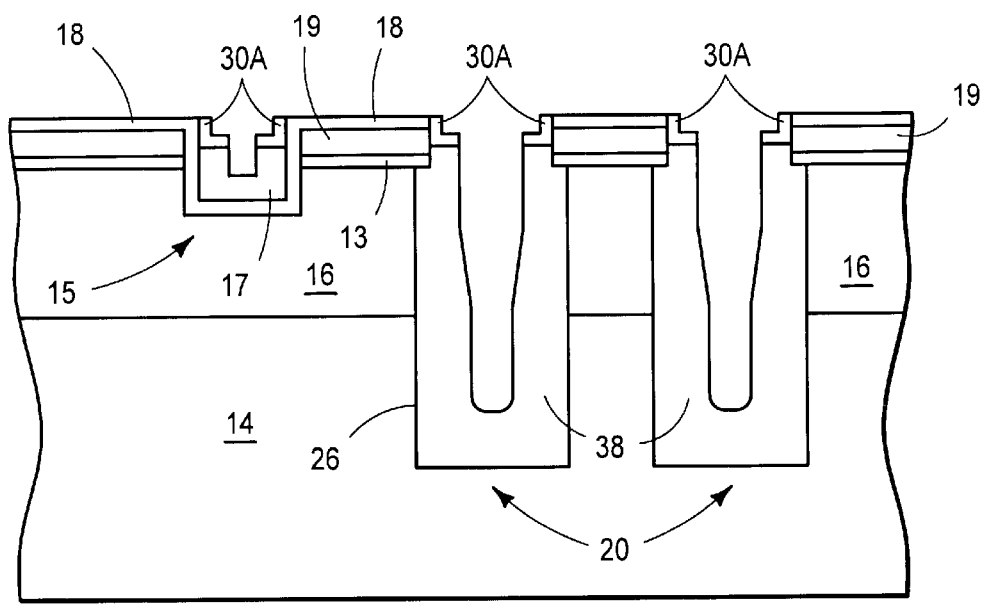
FIG. 6 is a cross-sectional view of the integrated circuit after a sixth fabrication stage.

FIG. 6 shows a cross-sectional view of integrated circuit 10 after a sixth fabrication stage. A reactive ion etch is applied to remove exposed silicon dioxide from isolation region 15 and trenches 20 as shown. A nitride wet etch is then applied to remove spacers 35.

Figure 7:
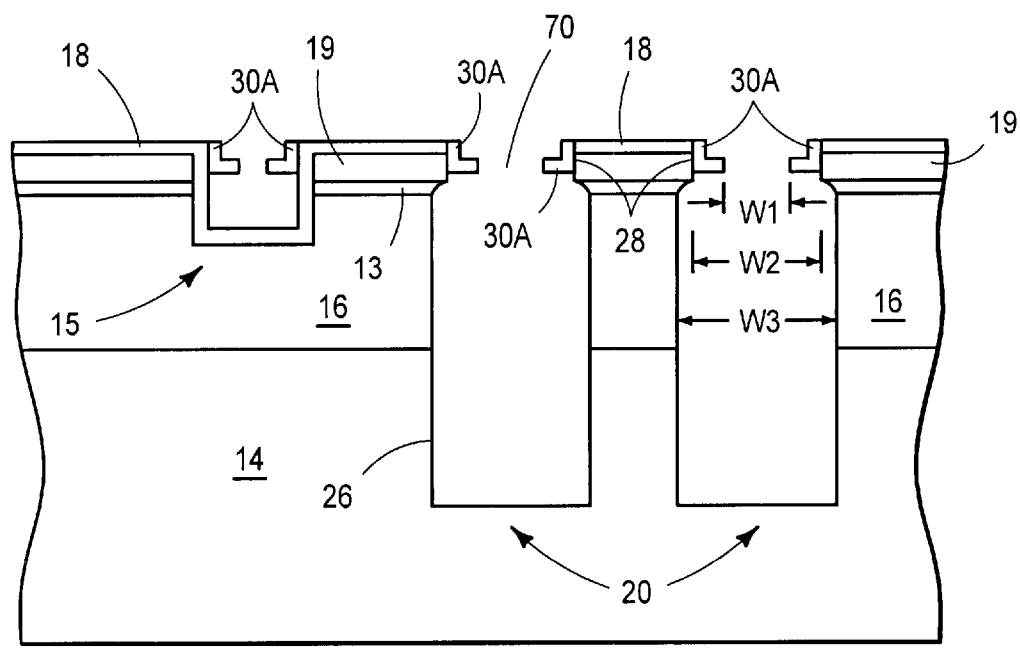
FIG. 7 is a cross-sectional view of the integrated circuit after a seventh fabrication stage.

FIG. 7 shows a cross-sectional view of integrated circuit 10 after a seventh fabrication stage. An oxide wet or dry etch is applied through openings 70 formed by ledges 30A to remove the remaining silicon dioxide material disposed within trenches 20 and isolation region 15.

Note that after trenches 20 are cleared of silicon dioxide material from dielectric layer 38, ledges 30A extend from, and are attached to, vertical surfaces 28. In most cases, polysilicon adheres quite securely to an adjacent polysilicon layer during subsequent processing. Accordingly, the presence of semiconductor layer 18 provides an adjacent semiconductor material to improve the adhesion of ledges 30A to surfaces 28. However, in certain applications, or for particular shapes of trenches 20, ledges 30A may adhere adequately to silicon nitride, i.e., dielectric layer 19, in which case semiconductor layer 18 may be omitted from the process.

Note further that ledges 30A project or extend from surfaces 28 so that the effective width W1 at the openings of trenches 20 is less than either the width W2 across surface 28 or the width W3 across lower portions of trenches 20, i.e., across surface 26. Since width W2 typically is formed to have the minimum photolithographic feature size of the semiconductor process, ledges 30A provide a means to reduce the opening of trenches 20 to a width less than the minimum feature size.

Figure 8:
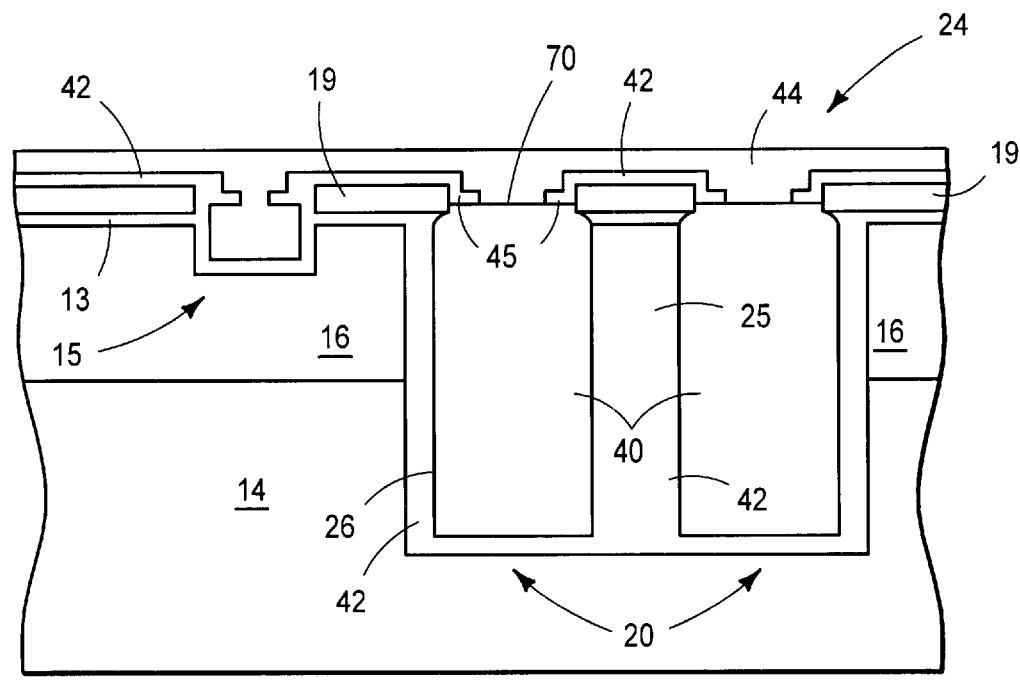
FIG. 8 is a cross-sectional view of the integrated circuit after a eighth fabrication stage.

FIG. 8 shows a cross-sectional view of integrated circuit 10 after an eighth fabrication stage.

Exposed semiconductor surfaces are thermally oxidized to convert semiconductor layer 18, ledges 30A, and surfaces of isolation region 15 and trenches 20 to an oxide layer 42. The oxidation of ledges 30A increases their volume to form oxide ledges 45 that further narrow openings 70 of trenches 20. In one embodiment, the spacing between adjacent trenches 20 is sufficiently small that the oxidation of sidewalls 26 extends oxide layer 42 across region 25. The permittivity of region 25 is thereby reduced from the permittivity of the semiconductor material to the permittivity of its oxide. In an embodiment in which the semiconductor material comprises silicon, the thermal oxidation step reduces the dielectric constant of region 25 from about twelve (for silicon) to about four (for silicon dioxide).

Dielectric material is then deposited on surfaces of integrated circuit 10 and planarized to produce a cap layer 44 that plugs openings 70 to seal off trenches 20 and produce a plurality of air pockets 40. Although referred to as air pockets, other gases or even a vacuum may be sealed within trenches 20 as a result of depositing the dielectric material. In one embodiment, this dielectric material comprises silicon dioxide, which quickly builds up on oxide ledges 45 and restricts the flow of dielectric material into trenches 20. Consequently, air pockets have a large volume owing to the prevention of dielectric material from accumulating on surfaces of trenches 20 in significant amounts. The overall permittivity of region 24 is determined by the relative volumes and dielectric constants of the materials disposed in region 24, including air pockets 40 whose dielectric constant is about 1.0. Since ledges 45 allow air pockets 40 to be formed with large volumes, the overall effective permittivity of region 24 is significantly lower than that of other structures.

The small size of openings 70 has the further advantage of determining the position of the upper surface of air pockets 40, which allows a thinner cap layer 44 to be formed while ensuring that air pockets 40 are sealed. Such a thinner cap layer 44 improves the compatibility with the subsequent formation of active devices by providing a more planar surface topography.

Figure 9:
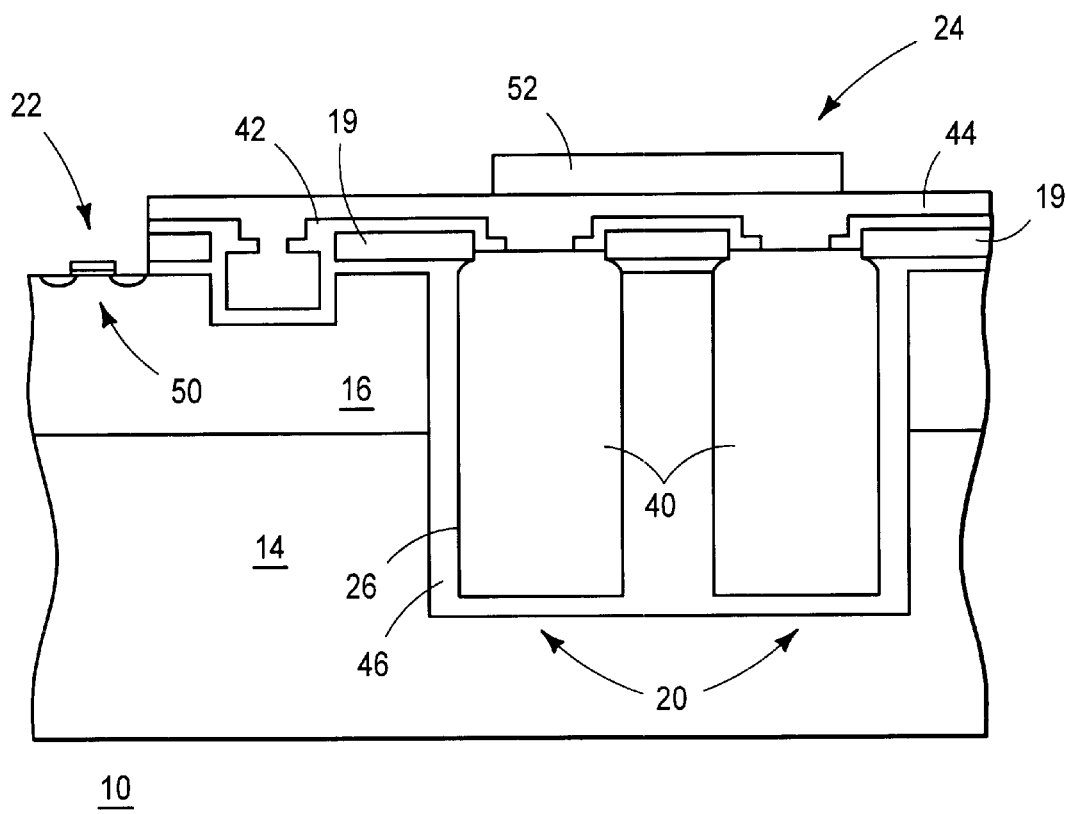
FIG. 9 is a cross-sectional view of the integrated circuit after a ninth fabrication stage.

FIG. 9 shows a cross-sectional view of integrated circuit 10 after an ninth fabrication stage. Integrated circuit 10 is patterned within active region 22 and etched to remove portions of layers 13, 19, 42 and 44 as shown. A transistor 50 is formed in epitaxial layer 16 after the formation of air pockets 40.

A passive component 52 is formed over dielectric layer 44 in low permittivity region 24. Passive component 52 may be a capacitor, a resistor, an inductor, a bonding pad or similar component. Passive component 52 has a low parasitic substrate capacitance, i.e., capacitance to base layer 14, owing to the large volume of air pockets 40 and the low permittivity of region 24. Consequently, passive component 52 has a higher frequency response than would a similar component formed on other structures.

In summary, the present invention provides a method of forming a region of low permittivity in an integrated circuit. A semiconductor layer is formed over a surface of a trench in a semiconductor substrate. A first material is removed from the trench by etching through an opening in the semiconductor layer that is smaller than a width of the trench. A second material is deposited to plug the opening to seal an air pocket in the trench. By making the opening in the semiconductor layer smaller than the width of the trench, the present invention allows a trench to be formed with a large volume air pocket while plugging or sealing the trench with a thin cap layer of dielectric material. The thinner cap layer improves compatibility with the subsequent formation of transistors on the same die and the large air pocket that provides a low permittivity to reduce the parasitic capacitance of passive components. The inventive method can be performed using standard semiconductor processes and equipment.

What is claimed is:

1. A method of making a semiconductor device, comprising the steps of:

forming a first layer over a surface of a semiconductor substrate formed with a trench;

disposing a first material in the trench to a level below the surface of the semiconductor substrate;

etching through an opening in the first layer that is smaller than a width of the trench to remove a first material from the trench; and depositing a second material to plug the opening to seal an air pocket in the trench.

2. The method of claim 1, further comprising the steps of:

forming a second layer over the first layer; and etching the second layer to form a spacer over the first layer adjacent to a sidewall of the trench; and masking an etch with the spacer to form the opening.

3. The method of claim 2, wherein the step of forming the second layer includes the step of depositing silicon nitride over the first layer.

4. The method of claim 3, wherein the step of depositing silicon nitride includes the step of forming a silicon nitride film to a thickness of about 0.2 micrometers.

5. The method of claim 2, wherein the step of forming the first layer includes the step of depositing polysilicon over a surface of the first material.

6. The method of claim 5, further comprising the step of oxidizing the first layer after the step of etching through the opening to form a ledge that extends from the sidewall of the trench.

7. The method of claim 6, wherein the step of oxidizing includes the step of thermally oxidizing the first layer and the sidewall of the trench.

8. The method of claim 1, wherein the step of etching includes the step of removing silicon dioxide from the trench.

9. The method of claim 1, wherein the step of depositing the second material includes the step of depositing silicon dioxide to seal the air pocket.

10. The method of claim 1, further comprising the step of etching the surface of the semiconductor substrate to form the trench.

11. The method of claim 10, wherein the step of etching the surface of the semiconductor substrate includes the step of removing semiconductor material to a depth between six and ten micrometers.

12. The method of claim 1, further comprising the step of forming the trench to have the width of about 0.6 micrometers.

13. A method of forming a low permittivity region in a substrate, comprising the steps of:

disposing a first layer over a recessed region of the substrate;

defining an opening in the first layer with a spacer formed along a step of the first layer;

removing a first material from the recessed region through the opening in the first layer to form a ledge with the first layer that extends from a sidewall of the recessed region to form an air pocket within the recessed region.

14. The method of claim 13, further comprising the step of depositing a second material over the ledge to seal the air pocket.

15. The method of claim 13, further comprising the steps of:

etching the substrate to form the recessed region; and disposing the first material in the recessed region.

16. The method of claim 13, wherein the step of disposing the first material includes the step of depositing an oxide in the recessed region to a level lower than a surface of the substrate, further comprising the step of forming a spacer on the surface of the first layer to define the opening.

17. The method of claim 13, further comprising the step of forming a transistor in an active region of the substrate.

18. A method of making a semiconductor device, comprising the steps of:

masking an etch with a spacer formed along a vertical step in a layer to form an opening in the layer; and etching through the opening to remove an underlying material to form an air pocket in a semiconductor substrate.

19. The method of claim 18, wherein the air pocket is formed in a trench, further comprising the steps of:

etching the semiconductor substrate to form the trench whose width is greater than a width of the opening;

disposing the material in the trench; and etching through the opening to remove the material.

20. The method of claim 19, further comprising the step of forming a cap layer over the trench to seal the air pocket.

* * * * *